United States Patent
Kim et al.

(10) Patent No.: US 8,901,577 B2
(45) Date of Patent: Dec. 2, 2014

(54) ORGANIC LIGHT-EMITTING DISPLAY DEVICE AND METHOD OF MANUFACTURING THE SAME

(75) Inventors: Kwang-Hae Kim, Yongin (CN); Jae-Beom Choi, Yongin (KR); Kwan-Wook Jung, Yongin (KR); June-Woo Lee, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 87 days.

(21) Appl. No.: 13/418,512

(22) Filed: Mar. 13, 2012

(65) Prior Publication Data

US 2013/0049029 A1 Feb. 28, 2013

(30) Foreign Application Priority Data

Aug. 26, 2011 (KR) .................. 10-2011-0085816

(51) Int. Cl.
  H01L 29/18 (2006.01)
  H01L 21/00 (2006.01)
  H01L 27/12 (2006.01)
  H01L 27/32 (2006.01)

(52) U.S. Cl.
  CPC ........... *H01L 27/124* (2013.01); *H01L 27/3262* (2013.01); *H01L 2924/0002* (2013.01)
  USPC ............................. 257/88; 438/22

(58) Field of Classification Search
  USPC ............. 257/40, 642–643, 759, 98, 488–491, 257/647, 684; 438/29, 69, 82, 99
  See application file for complete search history.

(56) References Cited

U.S. PATENT DOCUMENTS

| | | | |
|---|---|---|---|
| 2007/0120790 A1* | 5/2007 | Jeon | 345/87 |
| 2007/0181945 A1* | 8/2007 | Nakamura | 257/347 |
| 2008/0074137 A1* | 3/2008 | Kim et al. | 324/770 |
| 2009/0072229 A1* | 3/2009 | Suh et al. | 257/40 |
| 2009/0256469 A1* | 10/2009 | Park et al. | 313/504 |
| 2011/0204367 A1* | 8/2011 | Nakatani et al. | 257/59 |

FOREIGN PATENT DOCUMENTS

| | | |
|---|---|---|
| JP | 2002-229056 | 8/2002 |
| KR | 10-2001-004233 A | 1/2001 |
| KR | 10-2004-0037889 A | 5/2004 |
| KR | 10-2005-0006521 A | 1/2005 |
| KR | 10-2008-0098088 A | 11/2008 |
| KR | 10-2009-0120698 A | 11/2009 |

* cited by examiner

*Primary Examiner* — Julio J Maldonado
*Assistant Examiner* — Moin Rahman
(74) *Attorney, Agent, or Firm* — Lee & Morse, P.C.

(57) ABSTRACT

An organic light-emitting display device includes a gate electrode, a source electrode, and a drain electrode on a substrate, a gate interconnection line connected to the gate electrode, a source and drain interconnection line connected to the source and drain electrodes, a first test pad electrically connected to the source and drain interconnection line, and a second test pad electrically connected to the gate interconnection line. The second test pad is at a same level as the first test pad, and the gate electrode is on a different layer than the source and drain electrodes.

12 Claims, 5 Drawing Sheets

ORGANIC LIGHT-EMITTING DISPLAY DEVICE AND METHOD OF MANUFACTURING THE SAME

CROSS-REFERENCE TO RELATED PATENT APPLICATION

This application claims the benefit of Korean Patent Application No. 10-2011-0085816, filed on Aug. 26, 2011, in the Korean Intellectual Property Office, the disclosure of which is incorporated herein in its entirety by reference.

BACKGROUND

An organic light-emitting display device may include, e.g., a thin film transistor (TFT) and an organic electroluminescent device (EL device), which may be driven by the TFT and may produce an image. The TFT may include, e.g., a gate electrode, an active layer, and source and drain electrodes that are stacked on a substrate. The organic EL device may include, e.g., a pixel electrode, an opposite electrode disposed facing the pixel electrode, and an emission layer interposed between the pixel electrode and the opposite electrode.

SUMMARY

Embodiments may be realized by providing an organic light-emitting display device including a gate electrode and source and drain electrodes formed on different layers on a substrate, a gate interconnection line and a source and drain interconnection line respectively connected to the gate electrode and the source and drain electrodes, a first test pad electrically connected to the source and drain interconnection line, and a second test pad that may be disposed at the same level as the first test pad and may be electrically connected to the gate interconnection line.

The source and drain interconnection line may be formed on the gate interconnection line. The first test pad and the second test pad may be separately disposed on different sides of the substrate. The first test pad, the second test pad, and the source and drain interconnection line may be formed of the same material and at the same level. The second test pad may be connected to the gate interconnection line via a contact hole formed in an insulating layer formed between the gate electrode and the source and drain electrodes.

The organic light-emitting display device may further include a first electrode connected to one of the source and drain electrodes and a second electrode disposed facing the first electrode with an emission layer interposed therebetween. The first test pad, the second test pad, and the first electrode may be formed of the same material and at the same level.

The first test pad may be connected to the source and drain interconnection line via a contact hole passing through a passivation film formed between the source and drain electrodes and the first electrode. The second test pad may be connected to the gate interconnection line via a contact hole passing through the passivation film and an insulating layer sequentially deposited between the gate electrode and the first electrode.

Embodiments may also be realized by providing a method of manufacturing an organic light-emitting display device that includes forming a gate electrode and a gate interconnection line connected to the gate electrode on a substrate, forming an insulating layer on the gate electrode and the gate interconnection line, forming a contact hole in the insulating layer to expose a portion of the gate interconnection line, forming source and drain electrodes and a source and drain interconnection line connected to the source and drain electrodes on the insulating layer, forming a first test pad connected to the source and drain interconnection line and a second test pad connected to the gate interconnection line via the contact hole at the same level.

The first test pad and the second test pad may be separately disposed on different sides of the substrate. The first test pad, the second test pad, and the source and drain interconnection line may be formed of the same material and at the same level.

The method may further include forming a first electrode connected to one of the source and drain electrodes and a second electrode disposed facing the first electrode with an emission layer interposed therebetween. The first test pad, the second test pad, and the first electrode may be formed of the same material and at the same level.

The method may further include forming a passivation film between the source and drain electrodes and the first electrode. The contact hole may be formed further passing through the passivation film, the first test pad may be connected to the source and drain interconnection line via a contact hole passing through the passivation film, the second test pad may be connected to the gate interconnection line via the contact hole passing both the passivation film and the insulating layer.

The method may further include confirming the occurrence of a short in the source and drain interconnection line and the gate interconnection line by applying an electrical signal thereto through the first test pad and the second test pad, respectively, to measure a resistance thereof. The method may further include, if the occurrence of a short may be confirmed, stopping a subsequent manufacturing process for a corresponding product.

BRIEF DESCRIPTION OF THE DRAWINGS

Features will become apparent to those of ordinary skill in the art by describing in detail exemplary embodiments thereof with reference to the attached drawings in which.

DETAILED DESCRIPTION

Figure 1:
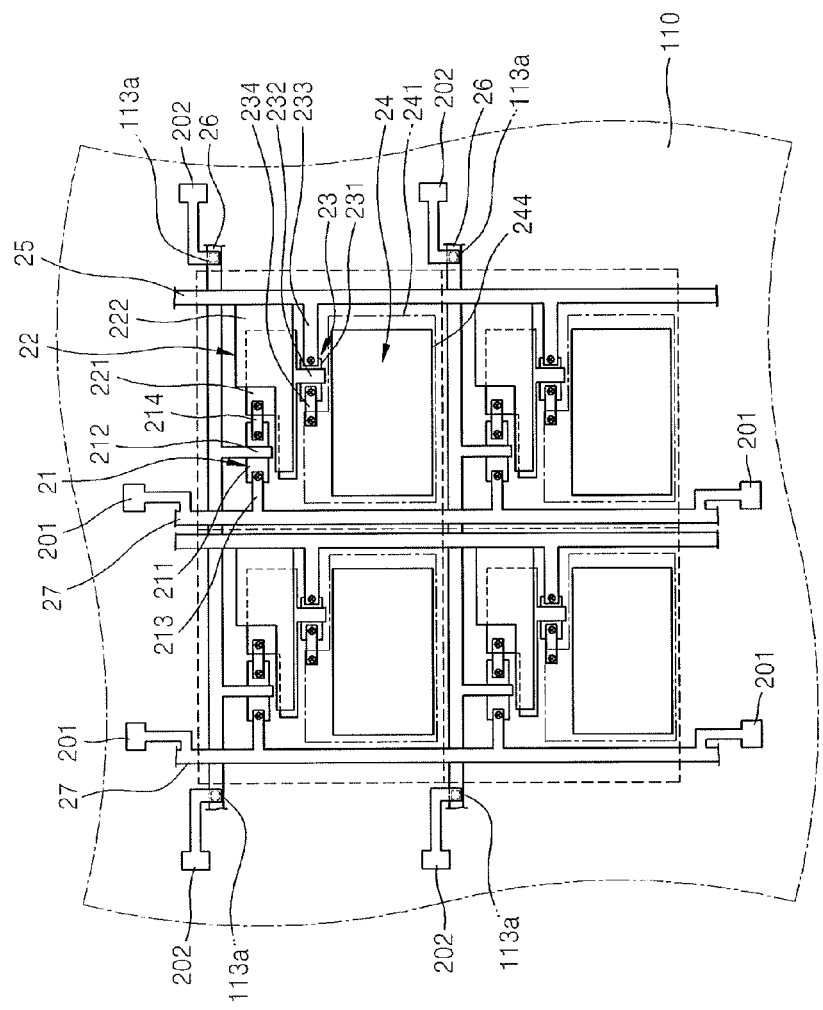
FIG. 1 illustrates a plan view of an organic light-emitting display device, according to an exemplary embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the figures, the dimensions of layers and regions may be exaggerated for clarity of illustration. It will also be understood that when a layer or element is referred to as being "on"

another layer or substrate, it can be directly on the other layer or substrate, or intervening layers or elements may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

Figure 2:
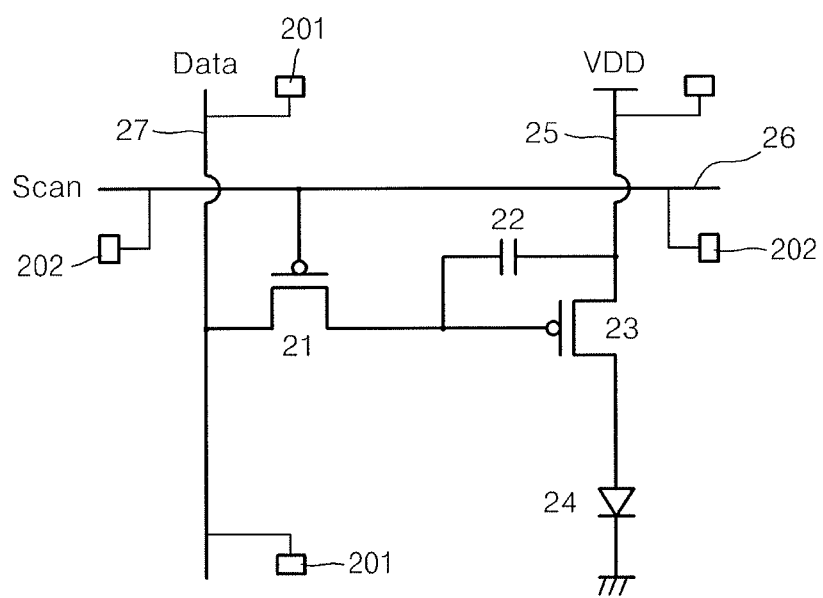
FIG. 2 illustrates an equivalent circuit diagram of an exemplary pixel included in the organic light-emitting display device of FIG. 1.

FIG. 1 illustrates a plan view of an organic light-emitting display device, according to an exemplary embodiment, and FIG. 2 illustrates an equivalent circuit diagram of an exemplary pixel included in the organic light-emitting display device of FIG. 1. For reference, although FIG. 1 illustrates only four pixels for ease of description, an actual product may include more pixels in column and row directions.

Referring to FIGS. 1 and 2, each of the pixels may include a first TFT 21 as a switching TFT, a second TFT 23 as a driving TFT, a capacitor 22 as a storage element, an organic electroluminescent device (EL) device 24 driven by the first and second TFTs 21 and 23, etc. The number of transistors and capacitors is not limited to the number illustrated and more than the number illustrated may be further included.

The first TFT 21 may be driven when a scan signal is applied thereto via a gate interconnection line 26 and may transmit a data signal to a data interconnection line 27. The data interconnection line 27 may be formed of a material used in the source and drain electrodes (213 and 214, see FIG. 3) and may be arranged at the same level and/or substantially the same level. For example, a portion of the data interconnection line 27 may be arranged along a horizontal line that also includes portions of the source and drain electrodes. Accordingly, the data interconnection line 27 will also be referred to as a source and drain interconnection line.

The second TFT 23, according to a signal transmitted through the first TFT 21, e.g., a voltage difference Vgs between a gate and a source, may determine the intensity of the current flowing into the organic EL device 24. The capacitor 22 may store the data signal transmitted through the first TFT 21 during one frame.

The organic light-emitting display device may further include a first test pad 201 electrically connected to the source and drain interconnection line 27. The first test pad 201 may correspond to at least one pixel and a plurality of first test pads 201 may be arranged. The organic light-emitting display device may include a second test pad 202 electrically connected to the gate interconnection line 26. The second test pad 202 may correspond to at least one pixel and a plurality of second test pads 202 may be arranged.

The first and second test pads 201 and 202 may be pads for a test, e.g., an open/short test (an OS test) that is carried out to identify whether a short occurs in the gate interconnection line 26 and/or the source and drain interconnection line 27 during the course of manufacturing the organic light-emitting display device. For example, an electric signal may be applied to the first and second test pads 201 and 202 through a probe of a tester (not shown) to determine and/or confirm whether the measured resistance is within a normal resistance range. If the measured resistance is outside the normal resistance range, it may be determined and/or confirmed that a short has occurred. Thereafter, the corresponding product may not be further processed and may be discarded. Detailed structures of the first and second test pads 201 and 202 and the OS test will be described below.

Figure 3:
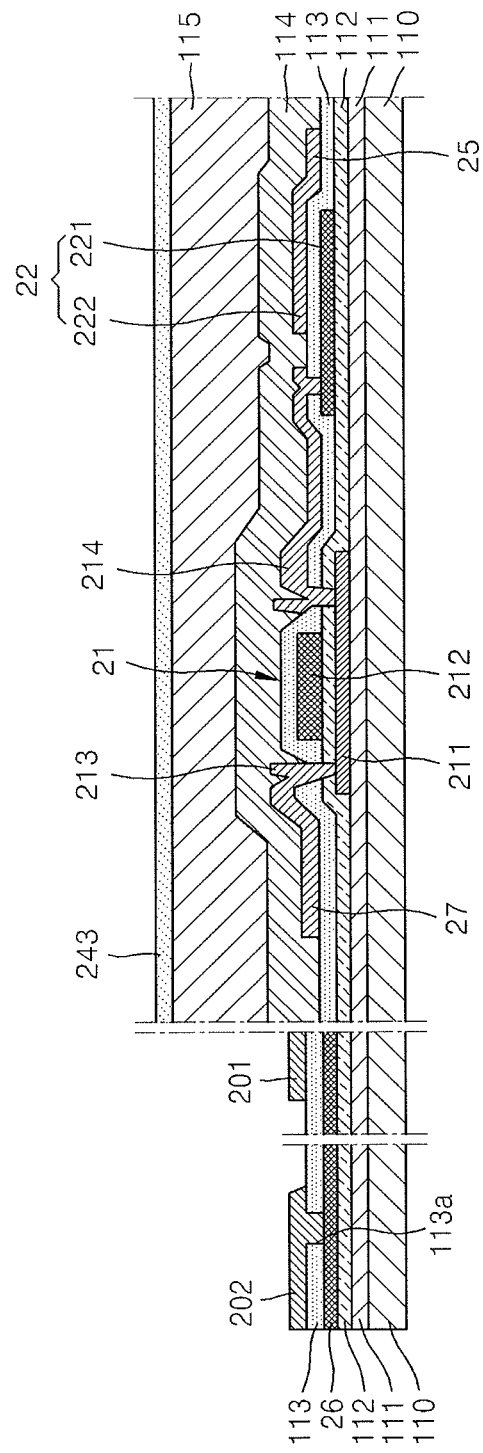
FIG. 3 illustrates a cross-sectional view of an exemplary TFT and an exemplary capacitor region included in the organic light-emitting display device of FIG. 1.
Figure 4:
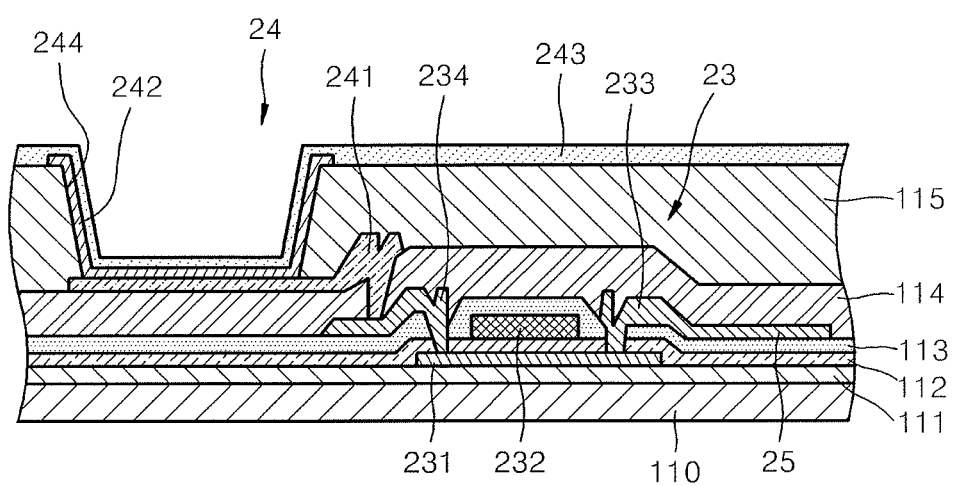
FIG. 4 illustrates a cross-sectional view of an exemplary TFT and an exemplary EL device region included in the organic light-emitting display device of FIG. 1.

FIGS. 3 and 4 illustrate cross-sectional views of the organic light-emitting display device of FIG. 1. FIG. 3 illustrates a stack structure including the first TFT 21, the capacitor 22 and the first and second test pads 201 and 202. FIG. 4 illustrates a stack structure including the organic EL device 24 and the second TFT 23.

Referring to FIGS. 3 and 4, a buffer layer 111 may include and/or be formed of, e.g., $SiO_2$. The buffer layer 111 may be formed on a substrate 110. The substrate 110 may be formed of, e.g., a glass material. The first TFT 21, the second TFT 23, the capacitor 22, and the organic EL device 24 may be formed on the buffer layer 111.

The first TFT 21, e.g., as illustrated in FIGS. 1 and 3, may include a first active layer 211 formed on the buffer layer 111, a gate insulating layer 112 formed on the first active layer 211, and a gate electrode 212 formed on the gate insulating layer 112.

The first active layer 211 may be formed of an amorphous silicon thin film or a polycrystalline silicon thin film. The first active layer 211 may have source and drain regions that are doped with a high-concentration of at least one of N-type and P-type impurities.

The gate insulating layer 112 may be formed of $SiO_2$ and may be formed on the first active layer 211. The gate electrode 212 may be formed as a conductive film formed of MoW or Al/Cu on the gate insulating layer 112. The gate electrode 212, e.g., as illustrated in FIG. 1, may be connected to the gate interconnection line 26 through which an on or off signal of a TFT may be applied. The gate electrode 212 and the gate interconnection line 26 may be formed of the same material and may be formed at the same level or substantially the same level. For example, a portion of the gate electrode 212 may be arranged along a horizontal line that includes a portion of the interconnection line 26.

An interlayer insulating layer 113 may be formed on the gate electrode 212. A source electrode 213 and a drain electrode 214 may be formed contacting the source and drain regions of the first active layer 211 via contact holes. The source electrode 213 may be connected to the source and drain interconnection line 27 illustrated in FIG. 1 and may supply a data signal to the first active layer 211. The drain electrode 214 may be connected to a first charge electrode 221 of the capacitor 22 and may supply power to the capacitor 22.

A passivation film 114 may be formed of, e.g., $SiO_2$ and/or $SiN_x$ and may be formed on the source and drain electrodes 213 and 214. A planarization film 115 may be formed of, e.g., an acryl and/or a polyimide, and may be formed on the passivation film 114.

The capacitor 22 may be disposed between the first TFT 21 and the second TFT 23 and may store a driving voltage for driving the second TFT 23 during one frame. As illustrated in FIGS. 1 and 3, the capacitor 22 may include the first charge electrode 221 that is connected to the drain electrode 214 of the first TFT 21. The capacitor 22 may include a second charge electrode 222 that is formed on the first charge electrode 221 to overlap with the first charge electrode 221 and that may be electrically connected to a driving power line 25 for applying a driving power. The capacitor 22 may include the interlayer insulating layer 113 that is interposed between the first charge electrode 221 and the second charge electrode 222, e.g., as a dielectric.

Also, as illustrated in FIG. 1, the first test pads 201 may be disposed on the upper and lower sides of the substrate 110, and the second test pads 202 may be disposed on the left and right sides of the substrate 110. However, embodiments are not limited thereto. According to an exemplary embodiment, the first and second test pads 201 and 202, the source and drain electrodes 213 and 214, and the source and drain interconnection line 27 may be formed of the same material and may be formed at the same level or substantially the same level. For example, portions of the first and second test pads 201 and 202, portions of the source and drain electrodes 213 and 214, and a portion of the source and drain interconnection line 27 may all be arranged along one horizontal line. According to an exemplary embodiment, when the source and drain electrodes 213 and 214 and the source and drain interconnection line 27 are patterned, the first and second test pads 201 and 202 may be patterned at the same time.

Among the first and second test pads 201 and 202, the first test pad 201, e.g., as illustrated in FIGS. 1 and 3, may be connected to the source and drain interconnection line 27 and the second test pad 202 may be connected to the gate interconnection line 26. According to an exemplary embodiment, when the gate interconnection line 26 is formed below the interlayer insulating layer 113 formed under the source and drain interconnection line 27, e.g., as illustrated in FIG. 3, a contact hole 113a may be formed in the interlayer insulating layer 113 to connect the second test pad 202 that is formed at the same level or substantially the same level as the source and drain interconnection line 27 to the gate interconnection line 26. By doing so, the second test pad 202 formed at the same level or substantially the same level as the source and drain interconnection line 27 may be connected to the gate interconnection line 26 via the contact hole 113a.

Once the first test pad 201 connected to the source and drain interconnection line 27 and the second test pad 202 connected to the gate interconnection line 26 are formed, whether the gate interconnection line 26 and/or the source and drain interconnection line 27 was shorted during manufacture may be determined, e.g., easily confirmed, by an OS test. For example, the gate interconnection line 26 may be tested for a short-defect after the source and drain interconnection line 27 is formed, a short defect that may occur between the formation of the gate interconnection line 26 and the formation of the source and drain interconnection line 27 may also be detectable. The OS test using the first and second test pads 201 and 202 will be described in detail below.

The second TFT 23, e.g., as illustrated in FIGS. 1 and 4, may include a second active layer 231 formed of, e.g., a amorphous silicon thin film or polycrystalline silicon thin film disposed on the buffer layer 111. The second active layer 231 may include source and drain regions doped with a high-concentration of at least one of N-type and P-type impurities. A gate electrode 232 may be formed on the second active layer 231 with the gate insulating layer 112 interposed therebetween. The gate electrode 232 may be connected to the first charge electrode 221 of the capacitor 22 and may be used to supply a signal for turning on or off the second TFT 23. The gate electrode 232 of the second TFT 23 and the gate electrode 212 of the first TFT 21 may be patterned simultaneously.

The second TFT 23 may include a source electrode 233 that is connected to the driving power line 25 to, e.g., supply a reference voltage for driving to the second active layer 231. The second TFT 23 may include a drain electrode 234 that connects the second TFT 23 to the organic EL device 24 to, e.g., apply a driving power to the organic EL device 24. The source and drain electrodes 233 and 234 of the second TFT 23 may be patterned simultaneously with the source and drain electrodes 213 and 214 of the first TFT 21. The interlayer insulating layer 113 may be formed between the gate electrode 232 and the source and drain electrodes 233 and 234. The passivation film 114 may be interposed between the source and drain electrodes 233 and 234 and a first electrode 241 of the organic EL device 24 as an anode.

The planarization film 115 may be formed on the first electrode 241. An opening 244 may be formed in the planarization film 115, followed by formation of the organic EL device 24.

The organic EL device 24 may display images by emitting red, green, or blue light according to a flow of current and includes the first electrode 241 that constitutes an anode. The first electrode 241 may be connected to the drain electrode 234 of the second TFT 23 and may receive a positive charge therefrom. The organic EL device 24 may include a second electrode 243 that constitutes a cathode, which may be disposed covering all of the pixels and may supply a negative charge. The organic EL device 24 may include an emission layer 242 that is disposed between the first and second electrodes 241 and 243 and that emits light.

The first electrode 241 as an anode may be a transparent electrode formed of, e.g., indium tin oxide (ITO). The second electrode 243 as a cathode may be, if the organic light-emitting display device is a bottom emission type display device in which light is emitted toward the substrate 110, formed by, e.g., depositing Al/Ca or the like on the whole surface of the substrate 110. The second electrode 243 may be, if the organic light-emitting display device is a top emission type display device in which light is emitted toward an encapsulation member disposed facing the substrate 110, formed by, e.g., forming a semi-transmissible thin film formed of Mg—Ag, followed by depositing a transparent material, such as ITO, thereon. The second electrode 243 may not be formed by whole-surface deposition and instead, may be formed with various patterns. However, embodiments are not limited thereto, e.g., the locations of the first electrode 241 and the second electrode 243 may be switched.

The emission layer 242 may be formed using, e.g., a low molecular weight or polymer organic film. If the emission layer 242 is formed of a low molecular weight organic film, a hole injection layer (HIL), a hole transport layer (HTL), an organic emission layer (EML), an electron transport layer (ETL), and an electron injection layer (EIL) may be stacked and each of them may have a single-layer structure or a multi-layer structure. An organic material used in the low molecular weight organic film may be, e.g., copper phthalocyanine (CuPc), N,N'-Di naphthalene-1-yl-N,N'-diphenyl-benzidine (NPB), or tris-8-hydroxyquinoline aluminum (Alq3). The low molecular weight organic film may be formed by, e.g., vacuum deposition.

The polymer organic film may have a structure including a HTL and an EML. For example, the HTL may be formed of, e.g., PEDOT, and the EML may be formed by, e.g., screen printing or inkjet printing a polyphenylene vinylene (PPV)-based or a polyfluorene-based polymer organic material.

Hereinafter, an exemplary method of manufacturing the organic light-emitting display device including forming the first and second test pads 201 and 202 and carrying out the OS test will be described in detail with reference to FIGS. 1 to 4.

First, the buffer layer 111, the active layers 211 and 231, and the gate insulating layer 112 of the first and second TFTs 21 and 23 may be sequentially formed in the stated order on the substrate 110. Then the gate electrodes 212 and 232 of the first and second TFTs 21 and 23 and the gate interconnection line 26 connected to the gate electrode 212 of the first TFT 21 may be formed simultaneously. The first charge electrode 221 may also be formed in a region for the capacitor 22.

Then, the interlayer insulating layer 113 may be formed on the gate electrodes 212 and 232 and the gate interconnection line 26. A contact hole 113a may be formed in the interlayer insulating layer 113, thereby exposing a portion of the gate interconnection line 26.

Then, the source and drain electrodes 213 and 214 and 233 and 234 of the first and second TFTs 21 and 23, respectively, and the source and drain interconnection line 27 connected to the source and drain electrodes 213 and 214 of the first TFT 21 may be formed on the interlayer insulating layer 113. Simultaneously, the first test pad 201 connected to the source and drain interconnection line 27 and the second test pad 202 connected to the gate interconnection line 26 via the contact hole 113a may be formed at the same level or substantially the same level. The second charge electrode 222 may also be formed in the region for the capacitor 22.

When the first test pad 201 electrically connected to the source and drain interconnection line 27 and the second test pad 202 electrically connected to the gate interconnection line 26 have been completely prepared, the organic light-emitting display device may be ready to be subjected to the OS test.

According to an exemplary embodiment, an electric signal may be applied through the first test pad 201 and the second test pad 202 to measure a resistance of the source and drain interconnection line 27 and the gate interconnection line 26, respectively. By doing so whether a short occurs in the source and drain interconnection line 27 and/or the gate interconnection line 26 may be determined and/or confirmed.

If the test results show that the measured resistance is outside a normal range, it confirms that a short has occurred, and the corresponding product may not be subjected to the subsequent manufacturing process and may be treated as a defective product. For example, before a final product is manufactured, that is, during manufacture, if an occurrence of a short is confirmed in advance, and thus, if a defect has occurred, unnecessary stages may not be performed thereon.

However, if the measured resistance is in the normal range, it is determined that there is no short. Thus, the subsequent stages for manufacturing the organic EL device 24 may be performed to complete the method of manufacturing the organic light-emitting display device.

Accordingly, according to the structure of the organic light-emitting display device and the method of manufacturing the organic light-emitting display device, during manufacture, whether the interconnection lines, namely, the gate interconnection line 26 and the source and drain interconnection line 27, are shorted may be easily confirmed through, e.g., the OS test carried out using the first and second test pads 201 and 202. For example, because the gate interconnection line 26 may be subjected to the short occurrence test after the source and drain interconnection line 27 is formed, a short defect that may occur between the formation of the gate interconnection line 26 and the formation of the source and drain interconnection line 27 may be confirmed. Also, because the first and second test pads 201 and 202 may be formed at the same level, the OS test performed on the gate interconnection line 26 and the source and drain interconnection line 27 may be able to be carried out at one time, thereby increasing process efficiency.

Figure 5:
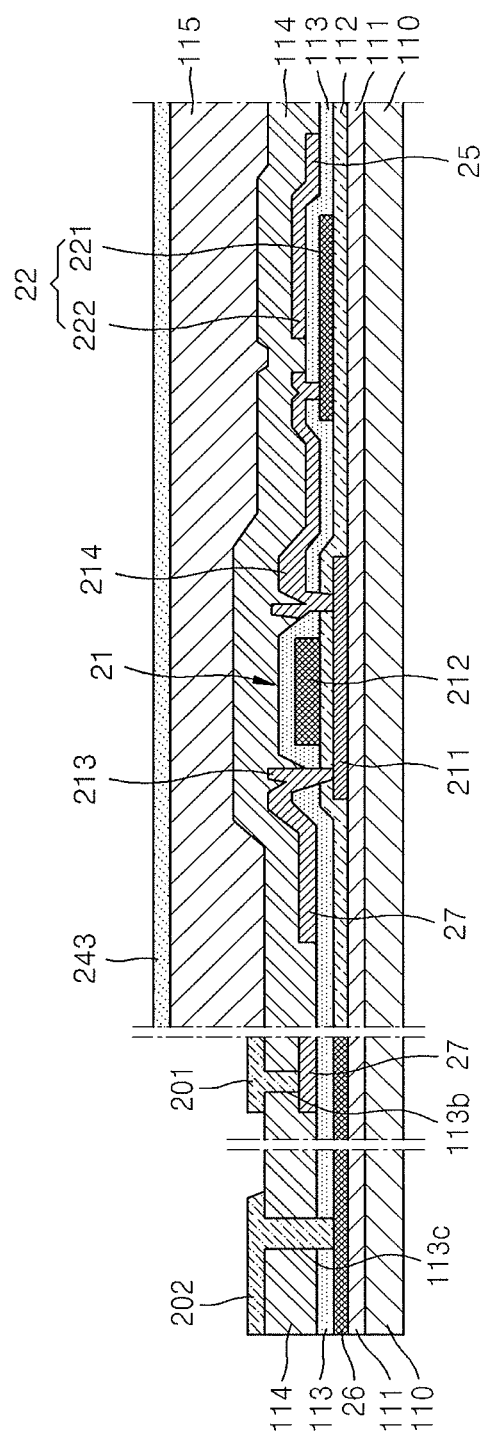
FIG. 5 illustrates a cross-sectional view of an exemplary TFT and an exemplary capacitor region included in an organic light-emitting display device, according to an exemplary embodiment.

Although according to an exemplary embodiment, the first and second test pads 201 and 202 are exemplarily formed at the same level as the source and drain interconnection line 27, embodiments are not limited thereto. For example, as illustrated in FIG. 5 in view of FIG. 4, the first and second test pads 201 and 202 and the first electrode 241 may be formed of the same material and at the same level or substantially the same level. For example, as illustrated in FIG. 5, the interlayer insulating layer 113, the source and drain interconnection line 27, and the passivation film 114 may be sequentially deposited in the stated order on the gate interconnection line 26.

Then, when the first electrode 241 of the organic EL device 24 is formed, the first and second test pads 201 and 202 may be formed at the same time.

To embody this structure, according to an exemplary embodiment, contact holes 113b and 113c may be formed through the passivation film 114 as well as the interlayer insulating layer 113. For example, the first test pad 201 may be connected to the source and drain interconnection line 27 via the contact hole 113b passing through the passivation film 114. The second test pad 202 may be connected to the gate interconnection line 26 via the contact hole 113c passing through both the passivation film 114 and the interlayer insulating layer 113.

Even in this structure, the first and second test pads 201 and 202 may be formed at the same level and the OS test may be carried out at one time. Also, because the OS test is carried out after the first electrode 241 of the organic EL device 24 is formed, any defect that may occur in the course of forming the first electrode 241 may also be confirmed. The first and second test pads 201 and 202 illustrated in FIG. 5 may be incorporated into an organic light-emitting display device as shown in FIG. 1.

By way of summation and review, when a current is supplied to a gate electrode via an interconnection line disposed on a substrate, the current may flow to source and drain electrodes via an active layer and may flow to a pixel electrode of an organic EL device that is connected to one of the source and drain electrodes. If the current flows to the pixel electrode through the TFT as described above, an appropriate voltage may be formed between the pixel electrode and an opposite electrode so as to cause an emission in the emission layer to produce an image.

An open/short test (OS test) may be performed to, e.g., determine and/or confirm whether a defect may have occurred in major interconnection lines in the course of manufacturing an organic light-emitting display device. The OS test may be carried out by applying an electric signal to a corresponding interconnection line to confirm whether a resistance thereof is within a desired resistance range. Through the OS test, it is possible to determine whether the tested interconnection line is in an open state, which corresponds to a normal state, or a shorted state, which corresponds to a defect state. For organic light-emitting display devices that are manufactured as small devices, it may be possible to better to carry out the OS test on a final product than on a not-yet-completed product to confirm the occurrence of a defect therein. However, due to the production of larger products, it may be more efficient to check for a defect during the manufacturing of the organic light-emitting display devices than on the final product.

Major interconnection lines of an organic light-emitting display device that may have the OS test performed thereon include, e.g., source and drain interconnection lines connected to the source and drain electrodes and a gate interconnection line connected to the gate electrode. According to a conventional stacked sequence, the gate interconnection line is formed and then the source and drain interconnection lines are formed. In particular, in the case of the gate interconnection line that is formed first, it a short may more likely occur when the source and drain interconnection lines are formed than when the gate interconnection line is formed. Accordingly, rather than carrying out the OS test whenever an interconnection line is formed, it may be more efficient to carry out the OS test on two interconnection lines at a time only after the gate interconnection line and the source and drain interconnection lines are all formed, e.g., for convenience of process and accuracy of the test.

In contrast, embodiments, e.g., the exemplary embodiments discussed above, relate to an organic light-emitting display device that has an improved structure for carrying out an OS test, e.g., for conforming whether an interconnection line is open or shorted. For example, the OS test may be effectively carried out on the gate interconnection line and/or the source and drain interconnection lines. Embodiments also relate to a method of manufacturing the organic light-emitting display device.

For example, embodiments may include a first test pad electrically connected to a source and drain interconnection line and a second test pad at the same level as the first test pad and electrically connected to a gate interconnection line. So that, e.g., when the organic light-emitting display device is used, whether a short occurs in an interconnection line may be easily confirmed by carrying out an open/short (OS) test using the first and second test pads during the manufacturing of the organic light-emitting display device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An organic light-emitting display device, comprising:
    a gate electrode, a source electrode, and a drain electrode on a substrate, the gate electrode being on a different layer than the source and drain electrodes;
    a gate interconnection line connected to the gate electrode;
    a source and drain interconnection line being coupled between a first test pad and the source or drain electrode;
    the first test pad electrically connected to the source and drain interconnection line; and
    a second test pad electrically connected to the gate interconnection line, wherein at least portions of the first test pad, the second test pad, the source and drain interconnection line, the source electrode, and the drain electrode are at a same or substantially same level.

2. The organic light-emitting display device of claim 1, wherein the source and drain interconnection line is on the gate interconnection line.

3. The organic light-emitting display device of claim 1, wherein the first test pad and the second test pad are spaced apart on different sides of the substrate.

4. The organic light-emitting display device of claim 1, wherein the first test pad, the second test pad, and the source and drain interconnection line are formed of a same material.

5. The organic light-emitting display device of claim 4, wherein the second test pad is connected to the gate interconnection line via a contact hole formed in an insulating layer, the insulating layer being formed between the gate electrode and the source and drain electrodes.

6. The organic light-emitting display device of claim 1, further comprising:
    a first electrode connected to one of the source and drain electrodes; and
    a second electrode facing the first electrode with an emission layer interposed between the second electrode and the first electrode, the first test pad, the second test pad, and the first electrode being formed of a same material.

7. The organic light-emitting display device of claim 6, wherein:
    the first test pad is connected to the source and drain interconnection line via a first contact hole passing through a passivation film, the passivation film being between the source and drain electrodes and the first electrode,
    the second test pad is connected to the gate interconnection line via a second contact hole passing through the passivation film and an insulating layer sequentially deposited between the gate electrode and the first electrode.

8. The organic light-emitting display device of claim 1, wherein a horizontal axis passes through at least the portions of the first test pad, the second test pad, the source and drain interconnection line, the source electrode, and the drain electrode.

9. The organic light-emitting display device of claim 1, wherein the first test pad sends a test signal to the source electrode or drain electrode along an unswitched signal path that includes the source and drain interconnection line.

10. The organic light-emitting display device of claim 1, wherein the second test pad sends a test signal to the gate electrode along an unswitched signal path that includes the gate interconnection line.

11. The organic light-emitting display device of claim 1, wherein the first test pad sends a test signal to the source electrode or drain electrode through the source and drain interconnection line independently of a switch.

12. The organic light-emitting display device of claim 1, wherein the second test pad sends a test signal to the gate electrode through the gate interconnection line independently of a switch.

* * * * *